(12) United States Patent
Ahn et al.

(10) Patent No.: US 8,304,097 B2
(45) Date of Patent: *Nov. 6, 2012

(54) WHITE ORGANIC LIGHT EMITTING DEVICE

(75) Inventors: Pil-soo Ahn, Suwon-si (KR); Sang-yeol Kim, Gwacheon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/342,021

(22) Filed: Dec. 31, 2011

(65) Prior Publication Data

US 2012/0097936 A1 Apr. 26, 2012

Related U.S. Application Data

(63) Continuation of application No. 11/943,152, filed on Nov. 20, 2007, now Pat. No. 8,110,293.

(30) Foreign Application Priority Data

Jan. 19, 2007 (KR) .................. 10-2007-0006303

(51) Int. Cl.
*H01L 51/54* (2006.01)

(52) U.S. Cl. ......... 428/690; 428/917; 313/504; 313/506

(58) Field of Classification Search .................. None
See application file for complete search history.

(56) References Cited

U.S. PATENT DOCUMENTS

| 5,707,745 | A | 1/1998 | Forrest et al. |
| 7,906,900 | B2 | 3/2011 | Song et al. |
| 2001/0053462 | A1 | 12/2001 | Mishima |
| 2002/0197511 | A1 | 12/2002 | D'Andrade et al. |
| 2003/0068528 | A1 | 4/2003 | Thompson et al. |
| 2005/0012450 | A1 | 1/2005 | Shinohara et al. |
| 2006/0227079 | A1 | 10/2006 | Kashiwabara |
| 2006/0273714 | A1 | 12/2006 | Forrest et al. |
| 2006/0279203 | A1 | 12/2006 | Forrest et al. |
| 2007/0200124 | A1 | 8/2007 | Suzuri et al. |
| 2008/0284317 | A1 | 11/2008 | Liao et al. |
| 2008/0286610 | A1 | 11/2008 | Deaton et al. |

FOREIGN PATENT DOCUMENTS

| JP | 2005150084 | 6/2005 |
| KR | 1020050028564 | 3/2005 |
| KR | 1020050074208 | 7/2005 |
| WO | 2006/009024 | 1/2006 |

OTHER PUBLICATIONS

Sun, Y. et al., "Management of singlet and triplet excitions for efficient white organic light-emitting devices", Nature, vol. 440, Apr. 13, 2006, pp. 908-912.

*Primary Examiner* — Dawn L Garrett
(74) *Attorney, Agent, or Firm* — Cantor Colburn LLP

(57) ABSTRACT

Provided is a white organic light emitting device including an anode, a cathode and an organic layer disposed therebetween, the organic layer having a structure wherein an arrangement of a green emissive layer and a blue emissive layer is formed on both surfaces of a red emissive layer such that the resultant structure is symmetrical around the red emissive layer, and a spacer layer is disposed between opposing surfaces of the blue emissive layer and the green emissive layer, where the white organic light emitting device including this structure exhibits a constant luminescence spectra irrespective of any change in current density. A method of forming the white organic light emitting device is also disclosed.

18 Claims, 5 Drawing Sheets

WHITE ORGANIC LIGHT EMITTING DEVICE

This application is a continuation of U.S. patent application Ser. No. 11/943,152, filed Nov. 20, 2007, which claims priority to Korean Patent Application No. 10-2007-0006303, filed on Jan. 19, 2007, and all the benefits accruing therefrom under 35 U.S.C. §119, the contents of which are incorporated herein by reference in their entirety.

BACKGROUND OF THE INVENTION

1. Field of the Invention

The present invention relates to a white organic light emitting device, and more particularly, to a white organic light emitting device emitting light having a color which is not affected by a change in current, has excellent luminescence efficiency, and long lifespan.

2. Description of the Related Art

Organic light emitting devices are self-emissive devices which use electroluminescence, and have high recognition ability, and are complete solid devices having excellent impact resistance. Therefore, organic light emitting devices have gained a great deal of attention and have been used in a variety of different kinds of display devices.

Organic light emitting devices basically have an anode/organic emissive layer/cathode structure, and can further comprise a hole injection layer, a hole transport layer, an electron injection layer, or the like. For example, the structure of anode/hole injection layer/hole transport layer/organic emissive layer/electron transport layer/cathode, and the structure of anode/hole injection layer/hole transport layer/organic emissive layer/electron transport layer/electron injection layer/cathode are known.

Recent development effort has focused on organic light emitting display devices, and in particular, white organic light emitting devices.

White organic light emitting devices are organic light emitting devices that emit white light, and can be used for various different applications such as paper-thin light sources, backlights for liquid crystal display devices, or light sources for full-color display devices employing color filters.

A method of forming an emissive layer of a white organic light emitting device can be categorized into two types. One is a method of forming a single emissive layer, and the other is a method of forming emissive multi-layers.

A single emissive layer can be prepared using a single material or by doping or blending at least two types of materials. For example, the single emissive layer can be formed using red and green dopants with a blue emissive host, or using red, green and blue dopants with an emissive host material having a large band gap energy. However, energy transfer into dopants generally is inefficient, and therefore is incomplete. Also, the single emissive layer can be formed using a bipolar host material having red, green, or blue luminescence moiety. However, adjusting the color balance that results in white emission can not be easily adjusted.

A white organic light emitting device comprising the emissive multi-layers can be a 3-wavelength white organic light emitting device comprising a red emission layer, a green emission layer and blue emission layer; or a 2-wavelength white organic light emitting device using complementary colors for red, green and blue.

For the 2-wavelength white organic light emitting device that uses complementary colors for red, green and blue, high efficiency can be obtained. However, white is obtained using the complementary colors, and thus realizing full colors using color filters is difficult and the range of colors that can be expressed is narrow. Whereas, in the case of the 3-wavelength white organic light emitting device, due to energy transfer between molecules, a uniform spectrum of three colors, that is, red, green and blue, can not generally be achieved and therefore light emission efficiency remains low.

Korean Patent Publication No. 2005-0028564 discloses a method of manufacturing a white organic light emitting device, comprising: doping any one pigment selected from green and red on a portion of or the whole of a surface of any one of a hole transport layer and an electron transport layer that are formed on upper and lower surfaces of a blue emission layer; and doping the other one of the green and red pigment on the other layer of the hole transport layer and the electron transport layer. In addition, Japanese Patent Laid-Open Publication No. 2005-150084 discloses a white organic light emitting device in which a double hole blocking layer comprising in order a first hole blocking layer disposed on a surface of the anode, a hole transport layer disposed on a surface of the first hole blocking layer opposite the anode, and a second hole blocking layer is formed on a surface of the hole transport layer opposite the first hole blocking layer, and an emissive layer is formed on a surface of the second hole blocking layer opposite the hole transport layer; the structure provided thereby has high color purity and luminance in spite of the structure of the emissive layers comprising a green emission layer, a blue emission layer and a red emission layer formed in this order. The white organic light emitting device is manufactured using a simple manufacturing process, but it still generally has a low light emission efficiency and color purity.

Meanwhile, when each emissive layer comprises only a phosphorescent material, excellent efficiency can be obtained even though the white organic light emitting device has a short operating lifespan due to instability of a blue phosphorescent material which further creates limited color stability. In particular, in the case of a white organic light emitting device which uses a blue phosphorescent dopant that is excited via a conductive host, the exchange energy loss is large in terms of power efficiency (i.e., because the energy loss during exchange is large, power efficiency is low), and a change in luminescence spectrum due to a change in current is also severe.

Korean Patent Publication No. 2005-0074208 discloses an organic electroluminescence device comprising a first electrode, a second electrode and an emissive layer structure that is disposed between the first electrode and the second electrode, the emissive layer structure comprising both a fluorescent emissive layer and a phosphorescent emissive layer disposed on the fluorescent, wherein the fluorescent emissive layer is an emissive layer that emits light of a blue wavelength. However, in such an organic electroluminescence device, the change in luminescence wavelength positions as a function of current change is large, and the internal luminescence efficiency in each of the fluorescent and phosphorescent emissive layers is high. Therefore, change in the luminescence spectrum as a function of current change is still high.

Yiru Sun et al. in *Nature,* 2006, vol. 440, p. 908 discloses an organic light emitting device manufactured such that a blue emissive layer that uses a fluorescent material is formed on both outer surfaces of an emissive layer structure, a spacer layer comprising only a host material is disposed on an inner surface of each of the blue emissive layers, and green and red emissive layers are disposed sequentially on the inner surfaces of the spacer layer such that the green and red emissive layers are disposed between both of the spacer layers, and as such the organic light emitting device has improved luminescence efficiency and increased lifespan.

FIG. 1 is a schematic cross-sectional view illustrating the structure of an emissive layer ("EML") 10 disposed between opposing surfaces of a hole transport layer/electron blocking layer ("HTL/EBL") 15 and an electron transport layer/hole blocking layer ("ETL/HBL") 16 of a conventional white organic light emitting device. Referring to FIG. 1, a blue emissive layer 13 is formed at both outermost surfaces of an emissive layer structure, a spacer layer 14 is formed on an inner surface of each of the blue emissive layers 13, and a red emissive layer 11 and a green emissive layer 12 are formed and disposed between the two spacer layers 14.

However, when the Schottky barrier of the electrodes is not equal, current flowing from the electrodes varies as a function of the change in voltage applied. Accordingly, in an emissive layer structure having a nonsymmetrical structure, luminescence spectrum varies according to current distribution.

Since current density as applied from both electrodes is not the same at all times, exciton transfer into blue, green and red emissive layers from an anode, and exciton transfer into the blue, green and red emissive layers from a cathode is not symmetrical. As a result, large changes in color can occur as a function of changes in current.

BRIEF SUMMARY OF THE INVENTION

The present invention provides a white organic light emitting device emitting light that has no change in color due to a change in current density, excellent luminescence efficiency and long lifespan.

According to an embodiment, a white organic light emitting device comprises an anode, a cathode and an organic layer disposed between opposing surfaces of the anode and the cathode, the organic layer comprising a first blue emissive layer, a first spacer layer disposed on a surface of the first blue emissive layer, a first green emissive layer formed on a surface of the first blue emissive layer opposite the first spacer layer, a red emissive layer disposed on a surface of the first green emissive layer opposite the first spacer layer, a second green emissive layer disposed on a surface of the red emissive layer, a second spacer layer disposed on a surface of the second green emissive layer opposite the red emissive layer, and a second blue emissive layer formed on a surface of the second spacer layer opposite the second green emissive layer in this order from a surface of the anode, wherein the blue emissive layer comprises a fluorescent dopant, and the red emissive layer and the green emissive layer each comprises a phosphorescent dopant.

The spacer layer can comprise a host material.

The spacer layer can be further formed between opposing surfaces of each green emissive layer and red emissive layer.

The blue emissive layer can comprise a host material and a fluorescent dopant.

In another embodiment, a method of forming a white organic light emitting device comprises forming an anode on a substrate; and sequentially forming a blue emissive layer, a spacer layer, a green emissive layer, a red emissive layer, a green emissive layer, a spacer layer, a blue emissive layer and a cathode to provide a layered stack in this order on the anode, wherein the blue emissive layer is formed first on the anode, and each successive layer formed on an exposed surface of the previously formed layer.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
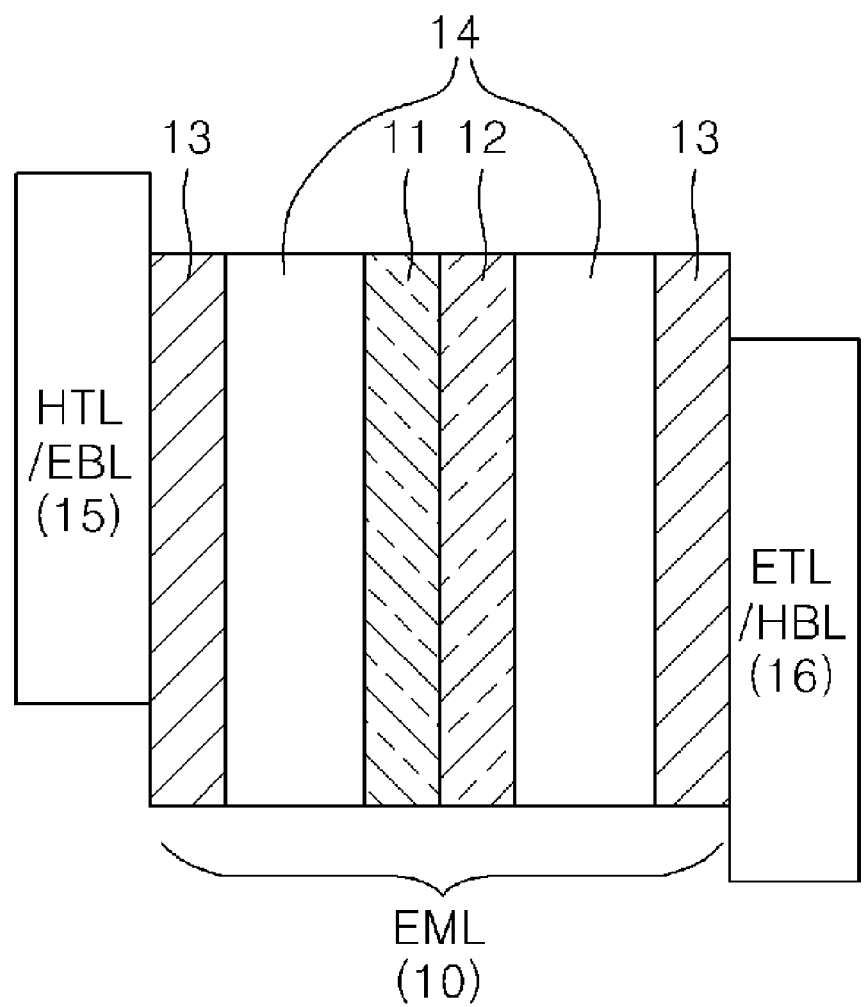
FIG. 1 is a schematic cross-sectional view illustrating the structure of an emissive layer of an exemplary conventional white organic light emitting device.

The present invention will now be described more fully with reference to the accompanying drawings, in which exemplary embodiments of the invention are shown.

It will be understood that when an element is referred to as being "on" another element, it can be directly on the other element or intervening elements may be present therebetween. In contrast, when an element is referred to as being "disposed on" or "formed on" another element, the elements are understood to be in at least partial contact with each other, unless otherwise specified.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As disclosed herein, a white organic light emitting device comprises an organic emissive layer wherein the organic emissive layer comprises a fluorescent blue emissive layer and phosphorescent green and red emissive layers, having a symmetrical structure in which the red emissive layer has a green emissive layer disposed on each surface of the red emissive layer, a spacer layer disposed on a surface of each green emissive layer opposite the red emissive layer, and a blue emissive layer disposed on a surface of the spacer layer opposite the green emissive layer, such that the spacer layer is disposed between the blue emissive layer and the green emissive layer. The white organic light emitting device so provided has no color change as a function of change in current density, has excellent luminescence efficiency, and has long lifespan.

That is, the present invention provides a white organic light emitting device including an anode, a cathode and an organic layer disposed between opposing surfaces of the anode and the cathode, wherein the organic layer includes an emissive layer comprising a first blue emissive layer, a first spacer layer disposed on a surface of the first blue emissive layer, a first green emissive layer disposed on a surface of the first spacer layer opposite the first blue emissive layer, a red emissive layer disposed on a surface of the first spacer layer opposite the first green emissive layer, a second green emissive layer disposed on the red emissive layer opposite the first green emissive layer, a second spacer layer disposed on a surface of the second green emissive layer opposite the red emissive layer, and a second blue emissive layer formed in this order from a surface of the anode wherein the blue emissive layer comprises a fluorescent dopant, and the green emissive layer and the red emissive layer each comprise a phosphorescent dopant.

Figure 2:
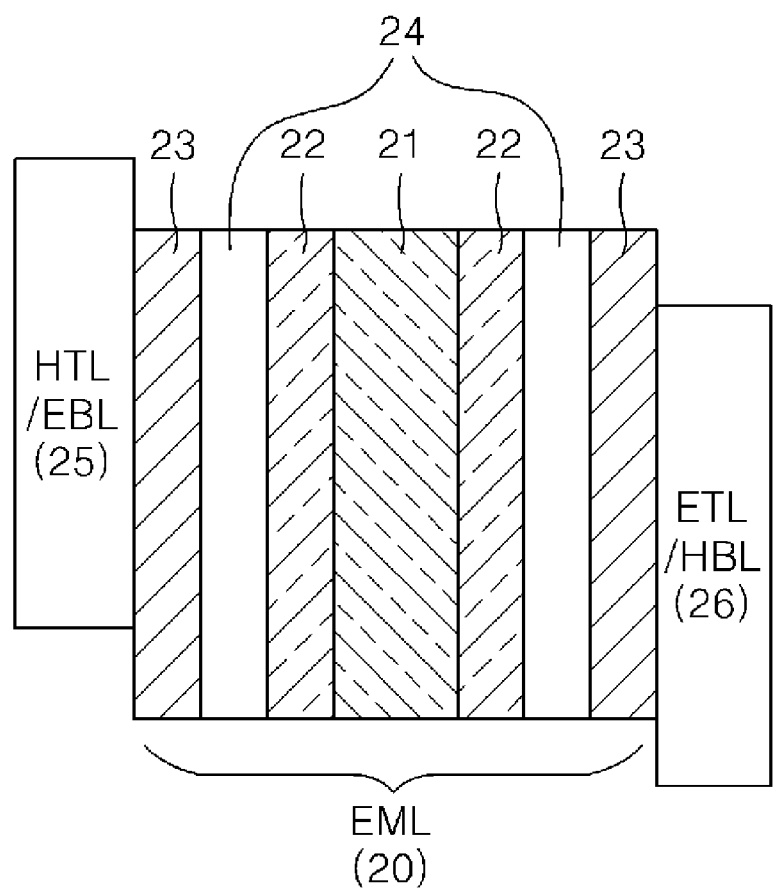
FIG. 2 is a schematic cross-sectional view illustrating the structure of an exemplary emissive layer of a white organic light emitting device according to an embodiment.

Referring to FIG. 2, a white organic light emitting device according to an embodiment of the present invention has a structure such that an emissive layer (EML) 20 including a red emissive layer 21, green emissive layers 22, blue emissive layers 23 and spacer layers 24 is formed between a hole transport layer/electron blocking layer (HTL/EBL) structure 25 and an electron transport layer/hole blocking layer (ETL/HBL) structure 26 that are formed on opposing inner surfaces of an anode and a cathode (not shown), respectively, wherein the red emissive layer 21 is formed in the middle of the EML 20, the green emissive layers 22 are formed on both surfaces of the red emissive layer 21, the spacer layers 24 are formed on outer surfaces of the green emissive layer 22, and the blue emissive layers 23 are formed on outer surfaces of the spacer layers 24. That is, the EML has a symmetrical structure such that the green emissive layer 22, the spacer layer 24 and the blue emissive layer 23 are formed in this order directed towards each electrode (i.e., anode and cathode) from the red emissive layer 21 formed in the middle of the EML.

Figure 3:
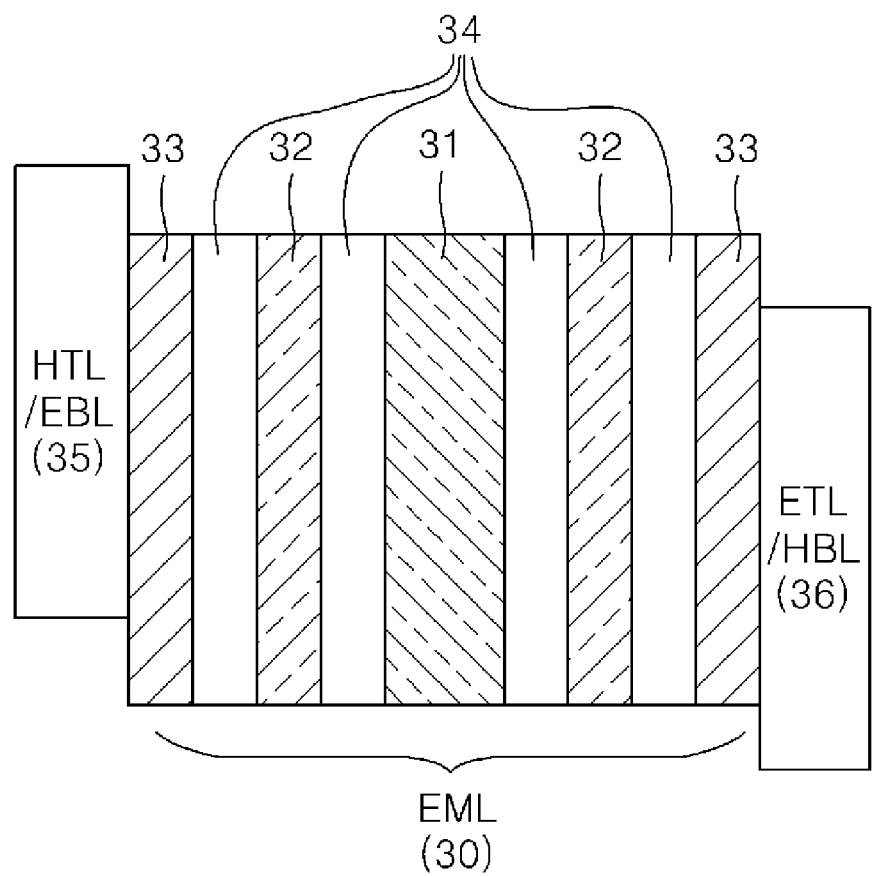
FIG. 3 is a schematic cross-sectional view illustrating the structure of an exemplary emissive layer of a white organic light emitting device according to another embodiment.

In addition, referring to FIG. 3, in addition to spacer layers 34 disposed between a blue emissive layer 33 and a green emissive layer 32, spacer layers 34 can be disposed between the green emissive layer 32 and a red emissive layer 31. A white organic light emitting device according to another embodiment of the present invention illustrated in FIG. 3 also has a symmetrical structure such that the spacer layer 34, the green emissive layer 32, the spacer layer 34 and the blue emissive layer 33 are formed in this order towards both electrodes from the red emissive layer 31 formed in the middle of the emissive layer.

In the white organic light emitting device, singlet excitons are transferred to a blue fluorescent material having a low doping concentration through a resonant Forster process, and not through direct trap formation. However, non-emissive host triplets cannot be efficiently transferred to a fluorescent material having a low doping concentration, and cannot be transferred by a Dexter transfer due to the low doping concentration. Meanwhile, triplets having a long diffusion length (about 100 nm), thus move to the middle of the emissive layer to be transferred to a phosphorescent material. There is an inevitable loss that occurs when triplets transfer to a red phosphorescent material which has the lowest energy. However, if host triplets are resonant-transferred to a green phosphorescent material, exchange energy loss can be avoided in this process.

If a spacer layer which is not doped and which comprises only a host material having a thickness greater than the Forster radius (i.e., greater than about 3 nm) is disposed between a layer of blue fluorescent material and adjacent layers of green and red phosphorescent materials, and in particular, where the layer of green fluorescent material is disposed between the layer of the spacer layer and the layer of red phosphorescent material, direct energy transfer to the green and red phosphorescent materials from the layer of blue dopant (i.e., the layer of blue fluorescent material) can be prevented. Therefore, the singlet excitons and the triplet excitons can be detected by a completely independent path. Accordingly, transfer of two types of excitons to a dopant from a host can be separately implemented.

Thus, exciton diffusion from a source at an edge (i.e., outer surface region adjacent to the electrodes) of an emissive layer is superior to exciton formation from a phosphorescent material and direct charge trapping. This is because charge carriers captured by a red phosphorescent material lead to a significant reduction in luminescence of a blue fluorescent material.

Singlet excitons at generation regions (i.e., regions where the singlet excitons form) of each side of the emissive layer are rapidly and near-resonantly transferred to a blue fluorescent dye on the regions. As disclosed herein, a phosphorescent doped region is separated from an exciton formation region by a spacer layer that is formed of an undoped host (also referred to as a binder) material at the center of the emissive layer. Triplet excitons are effectively diffused into the center region, and herein transferred to a green or red phosphorescent dopant having a lower energy. The triplet excitons are mostly transferred to a green dopant triplet manifold by a resonance process, and transferred to a red triplet with minor energy losses. The diffusion of singlet excitons into a phosphorescent dopant can be ignored due to a natural short diffusion length.

Figure 4:
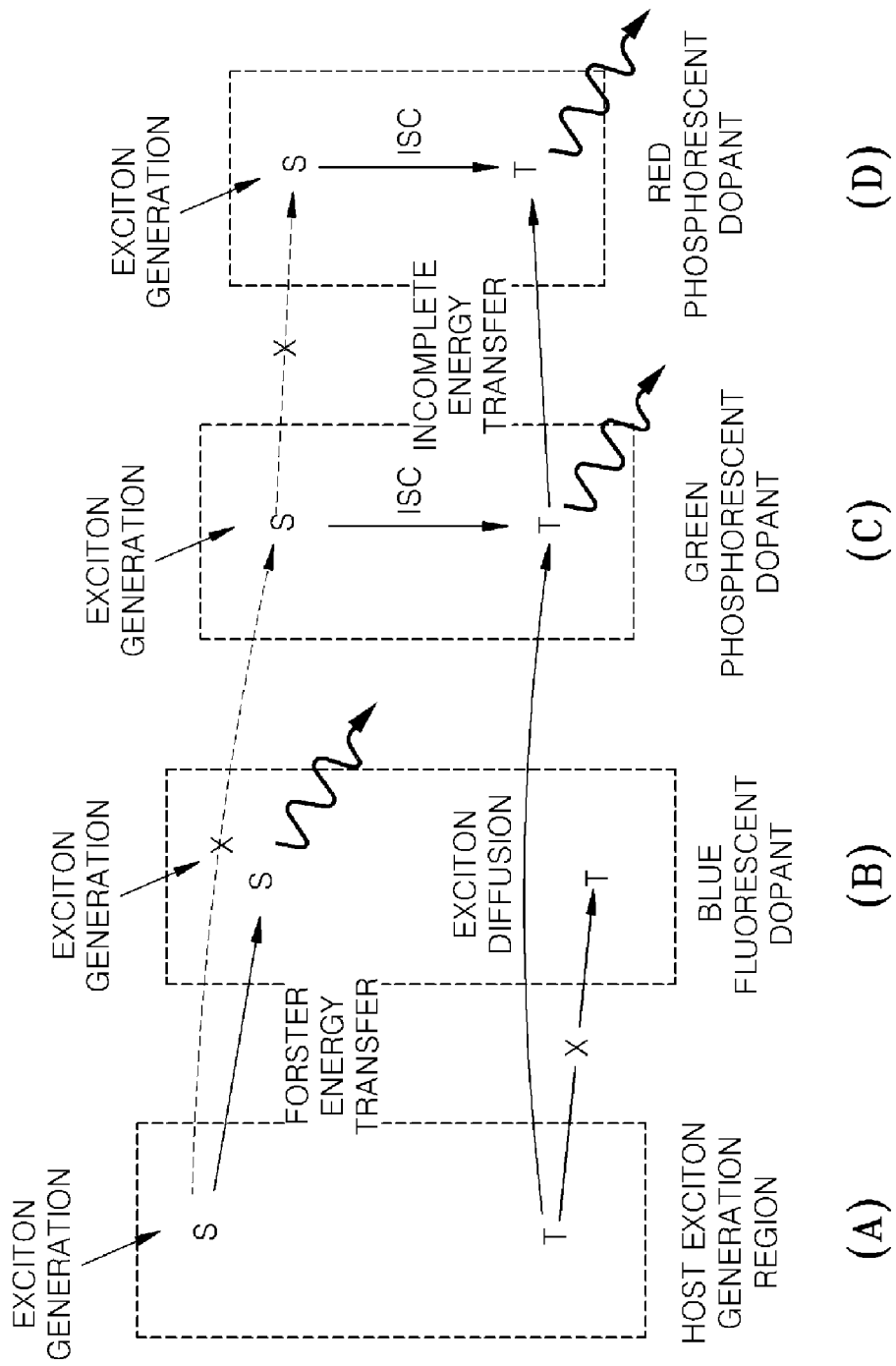
FIG. 4 is a flowchart illustrating luminescence paths of an exemplary white organic light emitting device according to an embodiment and FIG. 5 is a graph of electroluminescence spectrum as a function of current density of an exemplary white organic light emitting device of Example 1.

The white organic light emitting device uses a fluorescent dopant as a blue light emitting material and phosphorescent dopants as green and red light emitting materials. By disposing a spacer layer between a blue emissive layer and a green emissive layer, referring to FIG. 4, singlet excitons of excitons produced from a host material (A) are transferred to a blue fluorescent dopant (B) to emit light, and triplet excitons are sequentially diffused into green (C) and red (D) dopants to emit light. In this way, energy transfer of the singlet excitons and triplet excitons are implemented through separate independent paths.

In addition, the white organic light emitting device has a symmetrical structure in which a green emissive layer, a spacer layer and a blue emissive layer are formed in this order outwards towards each of two opposing electrodes (i.e., an anode and a cathode) from a single red emissive layer formed in the center of the white emissive layer, and thus although the density of current applied to the both electrodes is different, the color stability is excellent.

The white organic light emitting device can further include additional spacer layers disposed between each green emissive layer and the red emissive layer, in addition to the spacer layers disposed between the blue emissive layers and the green emissive layers. With a spacer layer formed between the green emissive layers and the red emissive layer, a desired spectrum can be obtained by adjusting the thickness of the spacer layer(s). That is, the greater the thickness of the spacer layer, the lower the number of triplets transferred to the red emissive layer from the green emissive layers, and in this way the relative emission of each individual emissive layer can be adjusted.

The blue emissive layer included in the white organic light emitting device comprises a fluorescent dopant. Examples of the fluorescent dopant include 4,4'-bis(9-ethyl-3-carbazovinylene)-1,1'-biphenyl ("BczVBi"), distyrylarylene ("DSA"), derivatives of DSA, distyrylbenzene ("DSB"), derivatives of DSB, 4,4'-bis(2,2'-diphenylvinyl)-1,1'-biphenyl ("DPVBi"), derivatives of DPVBi, spiro-DPVBi, 2,2',7,7'-tetrakis(biphenyl-4-yl)-9,9'-spirobifluorene ("spiro-6P"), and the like.

The thickness of the blue emissive layer can be about 2 to about 20 nm. Within this range, an OLED comprising the blue emissive layer has desirable optimum performance, and outside of the range, desired performance of the OLED can be somewhat adversely affected such that performance of the OLED is no longer optimal. In particular, when the thickness of the blue emissive layer is greater than about 20 nm, the transfer of the excitons to the green emissive layer may be insufficient.

The green emissive layer comprises a green phosphorescent dopant. Examples of the green phosphorescent dopant include $Ir(PPy)_3$ (where PPy=2-phenylpyridine), 3-(2-benzothiazolyl)-7-(diethylamino)coumarin (also referred to as coumarin 6), and the like.

The thickness of the green emissive layer can be about 2 to about 20 nm. Within this range, an OLED comprising the green emissive layer has desirable optimum performance, and outside of the range, desired performance of the OLED can be somewhat adversely affected such that performance of the OLED is no longer optimal. In particular, when the thickness of the green emissive layer is greater than about 20 nm, and since excitons received from the blue emissive layer are reduced in number as the distance between the green emissive layer and the blue emissive layer increases, the amount of excitons transferred to the red emissive layer may also be insufficient.

The red emissive layer comprises a red phosphorescent dopant. Examples of the red phosphorescent dopant include bis(2-phenylquinolyl-N,C2')acetylacetonate ("PQIr"), 4-(dicyanomethylene)-2-t-butyl-6-(1,1,7,7-tetramethyljulolidyl-9-enyl)-4H-pyran ("DCJTB"), platinum octatethyl porphine ("PtOEP", available as RD 61 from UDC), and the like.

The thickness of the red emissive layer can be about 5 to about 30 nm. When the red emissive layer is less than about 5 nm, it is too thin to sufficiently receive excitons transferred from the green emissive layers formed on both sides thereof, and when the red emissive layer is thicker than about 30 nm, outcoupling efficiency can be adversely affected.

A host material (also referred to as a binder) used in the emissive layer of the white organic light emitting device can be commonly used in each of the green emissive layer, the red emissive layer and the blue emissive layer. Examples of the host material include 4,4'-bis(N-carbazolyl)biphenyl ("CBP"), 2-t-butyl-9,10-di-(2-naphthyl)anthracene ("TBADN"), tris(8-hydroxy-quinolinato)aluminum ("Alq$_3$") and the like.

The spacer layer included in the white organic light emitting device can comprise only a host material. The host material for forming the spacer layer can be same as or different from the host material used for forming the red emissive layer, the green emissive layer and the blue emissive layer.

The thickness of the spacer layer can be about 4 to about 10 nm. When the thickness of the spacer layer is greater than the diffusion length of singlet excitons, the diffusion of singlet excitons can be prevented.

The white organic light emitting device can be manufactured using a conventional method.

In an embodiment, an anode is formed on a substrate; and a blue emissive layer, a spacer layer, a green emissive layer, a red emissive layer, a green emissive layer, a spacer layer, a blue emissive layer and a cathode are then each sequentially formed to provide a layered stack in this order on the anode, with the blue emissive layer being formed first on the anode, and each successive layer formed on an exposed surface of the previously formed layer. In addition, additional spacer layers can be further formed to be disposed between opposing surfaces of each green emissive layer and the red emissive layer.

The white organic light emitting device can further include a layer formed of an organic compound, such as an electron transport layer and/or a hole transport layer, in addition to the emissive layers, where the electron transport layer can be formed between the cathode and the emissive layers (specifically the blue emissive layer), and hole transport layer can be formed between the anode and emissive layers (specifically the blue emissive layer).

The white organic light emitting device can have a general structure comprising an anode/hole injection layer/hole transport layer/emissive layer/electron transport layer/electron injection layer/cathode structure, an anode/hole injection layer/emissive layer/electron transport layer/electron injection layer/cathode structure, an anode/hole injection layer/hole transport layer/emissive layer/hole blocking layer/electron transport layer/electron injection layer/cathode structure, or like structure. As disclosed herein, the emissive layer is as defined hereinabove for the white organic light emitting layer in the white organic light emitting device.

In an embodiment, preparation of the layered structure of the white organic light emitting device can be performed as follows. First, a first electrode is formed by depositing or sputtering a high work-function material for an anode on a surface of a substrate. The first electrode can be used as an anode. The substrate, which can be any substrate that is used in conventional organic light emitting devices, may be a glass substrate or a transparent plastic substrate that has excellent mechanical strength, thermal stability, transparency, and surface smoothness, can be easily treated, and can be waterproof.

The material for the anode can be formed of indium tin oxide ("ITO"), indium zinc oxide ("IZO"), $SnO_2$, ZnO, or any transparent material having high conductivity.

Then, a hole injection layer ("HIL") can be formed on a surface of the anode opposite the substrate by various methods such as vacuum deposition, spin coating, casting, Langmuir Blodgett ("LB") deposition, or the like.

When the HIL is formed by vacuum deposition, vacuum deposition conditions can be varied according to the compound that is used to form the HIL and the desired structure and thermal properties of the HIL to be formed. In general, however, the vacuum deposition can be performed at a deposition temperature of about 100 to about 500° C., a pressure of about $10^{-8}$ to about $10^{-3}$ torr, a deposition speed of about 0.01 to about 100 Å/sec, and to a layer thickness of about 10 Å to about 5 μm.

When the HIL is formed by spin coating, coating conditions can vary according to the compound that is used to form the HIL, and the desired structure and thermal properties of the HIL to be formed. In general, however, the coating speed can be about 2,000 to about 5,000 rpm, and a temperature for heat treatment, which is performed to remove any solvent after coating, can be about 80 to about 200° C.

A material used to form the HIL may be known hole injection materials such as a phthalocyanine compound, such as copper phthalocyanine; a star-burst type amine derivative, such as 4,4',4"-tris(N-carbazolyl)-triphenylamine ("TCTA"), 4,4',4"-tris(3-methylphenylphenylamino)triphenylamine ("m-MTDATA"), 1,3,4-tris{-4-[methylphenyl(phenyl)amino]phenyl}benzene ("m-MTDAPB"); soluble and conductive polymer such as polyaniline/dodecylbenzenesulfonic acid ("PANI/DBSA"); poly(3,4-ethylenedioxythiophene)/poly(4-styrenesulfonate) ("PEDOT/PSS"): polyaniline/camphor sulfonic acid ("PANI/CSA"); (polyaniline)/poly(4-styrenesulfonate) ("PANI/PSS"); or the like. In an exemplary embodiment, the HIL material can be PANI/DBSA or PEDOT/PSS

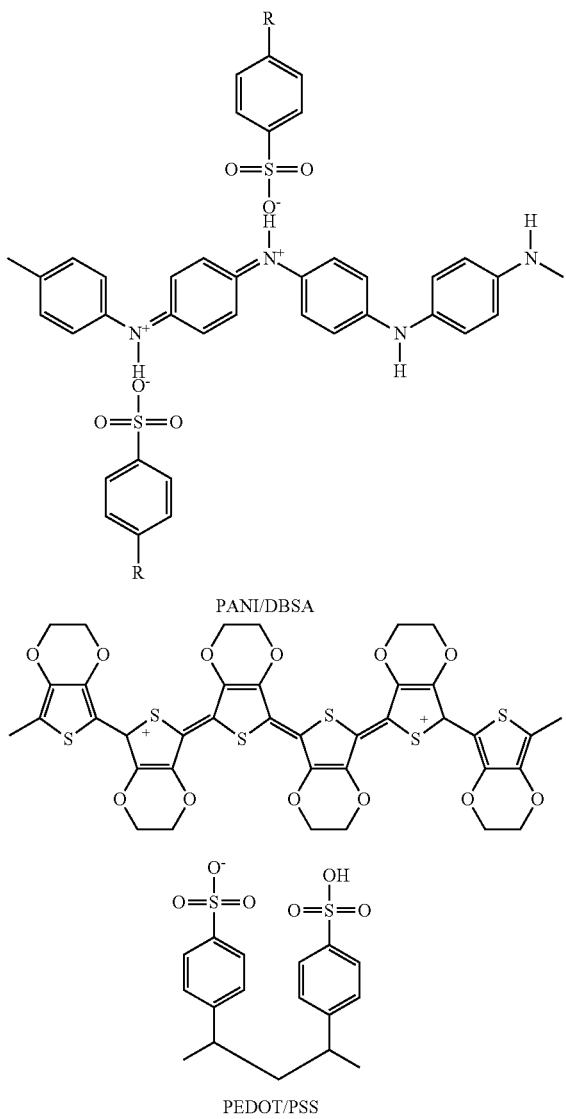

PANI/DBSA

PEDOT/PSS

The thickness of the HIL can be about 100 to about 10,000 Å, and specifically about 100 to about 1,000 Å. When the thickness of the HIL is less than about 100 Å, the hole injecting ability of the HIL may be reduced. On the other hand, when the thickness of the HIL is greater than about 10,000 Å, the turn-on voltage of the organic light emitting device may increase.

Next, a hole transport layer ("HTL") can be formed on a surface of the HIL opposite the anode using various methods such as vacuum deposition, spin coating, casting, LB, or the like. When the HTL is formed by vacuum deposition or spin coating, the deposition and coating conditions are similar to those for the formation of the HIL, although the deposition and coating conditions can vary according to the material that is used to form the HTL.

A material used to form the HTL can be a known hole transporting material such as a carbazole derivative, such as N-phenylcarbazole, polyvinylcarbazole; a typical amine derivative having an aromatic condensation ring such as N,N-bis(3-methylphenyl)-N,N'-diphenyl-[1,1-biphenyl]-4,4'-diamine ("TPD"), N,N'-di(naphthalene-1-yl)-N,N'-diphenyl benzidine ("α-NPD"); or the like.

The thickness of the HTL can be about 50 to about 1,000 Å, and specifically about 100 to about 600 Å. When the thickness of the HTL is less than about 50 Å, the hole transporting ability of the HTL may be reduced. On the other hand, when the thickness of the HTL is greater than about 1,000 Å, the turn-on voltage of the organic light emitting device may increase.

Then, a light emitting unit and a charge generating layer (also referred to hereinabove as an emitting layer, "EL", and as described hereinabove) can be formed on a surface of the HIL opposite the anode, or on a surface of the HTL opposite the HIL, by vacuum deposition, spin coating, casting, LB deposition, or the like. When the light emitting unit (EL) is formed by vacuum deposition or spin coating, the deposition and coating conditions are similar to those for the formation of the HIL, although the deposition and coating conditions can vary according to the material that is used to form the light emitting unit.

The total thickness of the light emitting unit and the charge generating layer EL can be about 100 to about 1,000 Å, specifically about 200 to about 700 Å. When the thickness of the light emitting unit and the charge generating layer is less than about 100 Å, the light emitting ability may be reduced. On the other hand, when the thickness of the light emitting unit and the charge generating layer EL is greater than about 1,000 Å, the turn-on voltage of the white organic light emitting device can increase.

To prevent triplet excitons or holes from being diffused into an electron transport layer, a hole blocking layer ("HBL") can be formed on a surface of the EL opposite the HTL, or on a surface of the HIL opposite the anode by vacuum deposition, spin coating, casting, LB deposition, or the like. When the HBL is formed by vacuum deposition or spin coating, the deposition and coating conditions are similar to those for the formation of the HIL, although the deposition and coating conditions can vary according to the material that is used to form the HBL. A known available hole blocking material can be, for example, an oxadiazole derivative, a triazole derivative, a phenanthroline derivative such as 2,9-dimethyl-4,7-diphenyl phenanthroline, ("BCP"), an aluminum complex such as bis(2-methyl-8-quinolinolato)-aluminum biphenolate ("BAlq") or the like, examples of which are shown below.

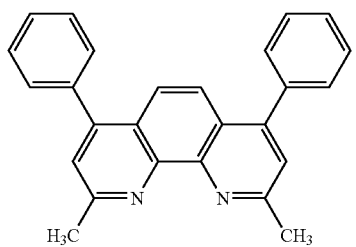

Phenanthroline-containing organic compound

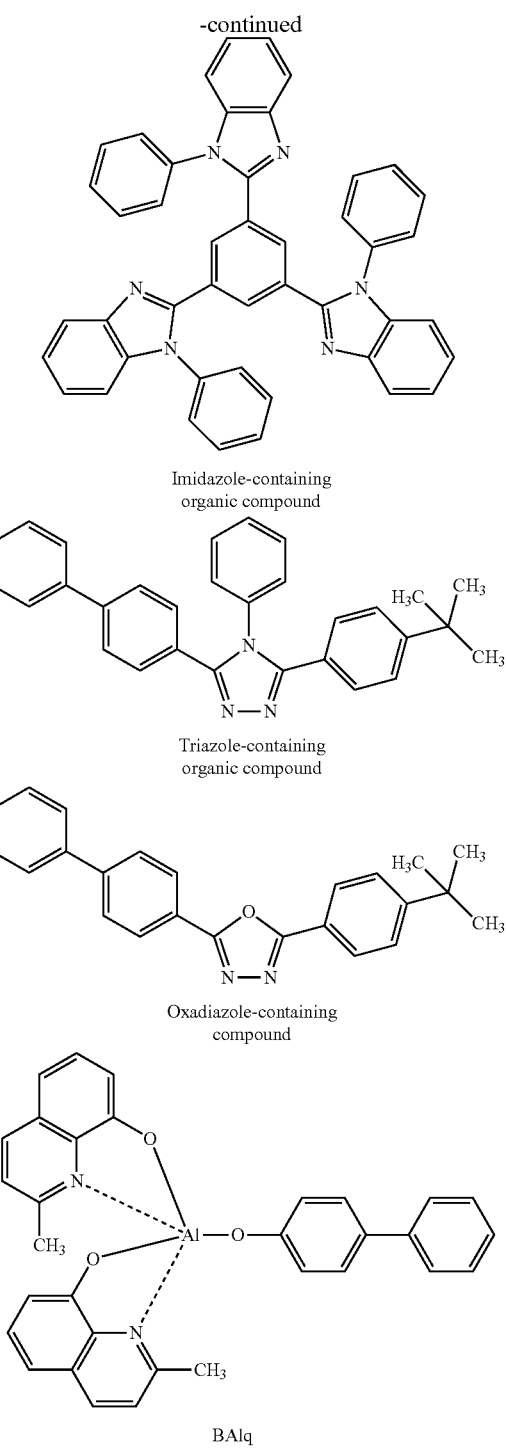

Imidazole-containing organic compound

Triazole-containing organic compound

Oxadiazole-containing compound

BAlq

The thickness of the HBL can be about 50 to about 1,000 Å, specifically about 100 to about 300 Å. When the thickness of the HBL is less than about 50 Å, the hole blocking ability of the HBL may be reduced. On the other hand, when the thickness of the HBL is greater than about 1,000 Å, the turn-on voltage of the white organic light emitting device can increase.

Then, an electron transport layer ("ETL") can be formed on a surface of the HBL opposite the EL, or on a surface of the EL opposite the HTL depending on the structure, using various methods such as vacuum deposition, spin coating, casting, or the like. When the ETL is formed by vacuum deposition or spin coating, the deposition and coating conditions are similar to those for the formation of the HIL, although the deposition and coating conditions can vary according to the material that is used to form the ETL. The material used to form the ETL stably transports electrons injected from a cathode, and can be a known material such as 2,9-dimethyl-4,7-diphenyl-1,10-phenanthroline (BCP), an oxazole-based compound, an isooxazole-based compound, a triazole-based compound, an isothiazole-based compound, an oxadiazole-based compound, a thiadiazole-based compound, a perylene-based compound, an aluminum complex such as, for example, tris(8-quinolinolato)-aluminum ("Alq$_3$"), BAlq, bis(2-methyl-8-quinolinolato)-aluminum triphenylsilicide ("SAlq"), tris(2-methyl-8-quinolinolato)-aluminum ("Almq3"), a gallium complex such as for example, bis(2-methyl-8-quinolinolato)-gallium pivalate ("Gaq'2OPiv"), bis(2-methyl-8-quinolinolato)-gallium acetate ("Gaq'2OAc"), μ-oxo-bis[bis(2-methyl-8-quinolinolato)-gallium] ("2(Gaq'2"), or the like.

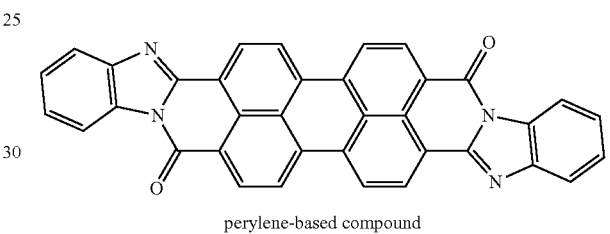

perylene-based compound

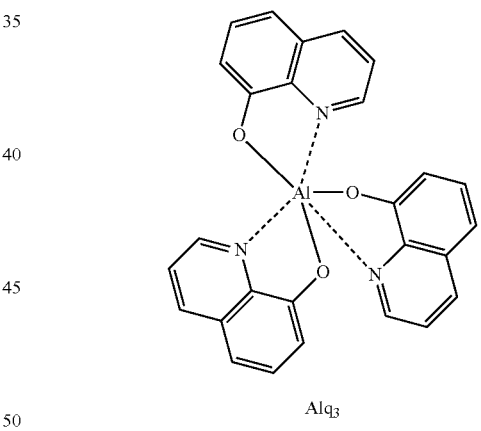

Alq$_3$

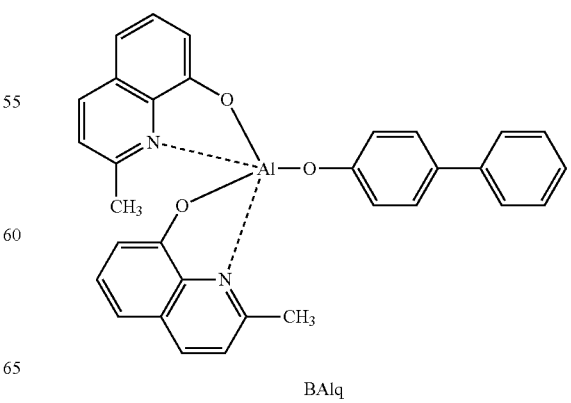

BAlq

-continued

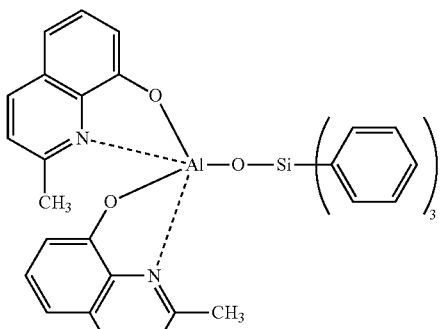
SAlq

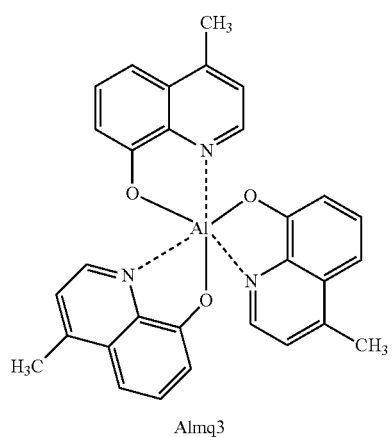
Almq3

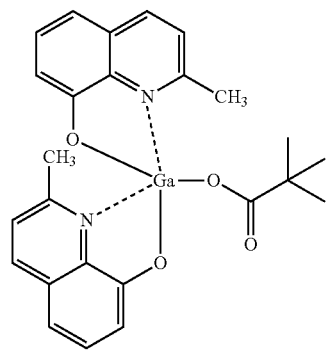
Gaq'2OPiv

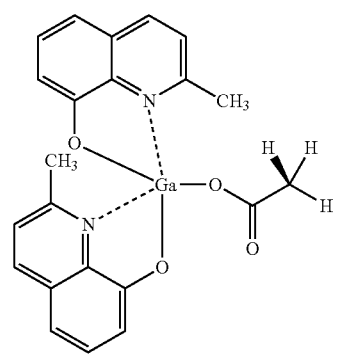
Gaq'2Oac

-continued

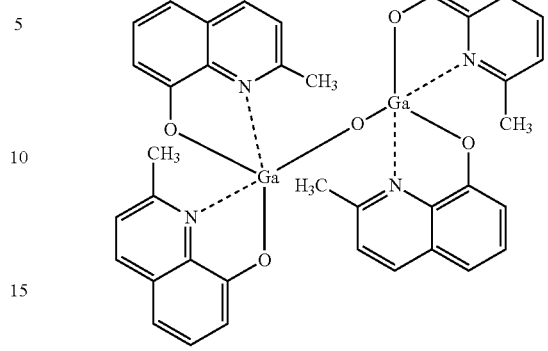
2(Gaq'2)

The thickness of the ETL can be about 100 to about 1,000 Å, specifically about 200 to about 500 Å. When the thickness of the ETL is less than about 100 Å, the electron transporting ability of the ETL may be reduced. On the other hand, when the thickness of the ETL is greater than about 1,000 Å, the turn-on voltage of the white organic light emitting device can increase.

In addition, an electron injection layer ("EIL") that promotes electron injection from a cathode may be formed on a surface of the ETL opposite the EL, or on the ETL opposite the HBL, depending on the structure. Materials used to form the EIL are not particularly limited.

The EIL may be formed of LiF, NaCl, CsF, $Li_2O$, BaO, or the like, any of which is any material useful for forming the EIL. Conditions for the deposition of the EIL are, in general, similar to conditions for the formation of the HIL, although they can vary according to the material that is used to form the EIL.

The thickness of the EIL can be about 1 to about 100 Å, specifically about 5 to about 50 Å. When the thickness of the EIL is less than about 1 Å, the electron injecting ability of the EIL may be reduced. On the other hand, when the thickness of the EIL is greater than about 100 Å, the turn-on voltage of the white organic light emitting device can increase.

Finally, a second electrode can be formed on the EIL by vacuum deposition, sputtering, or the like. The second electrode can be used as a cathode. The second electrode may be formed of a low work-function metal, an alloy, an electrically conductive compound, or a combination thereof. In particular, the second electrode may be formed of Li, Mg, Al, Al—Li, Ca, Mg—In, Mg—Ag, or the like. Alternatively, a transparent cathode formed of ITO or IZO can be used to produce a front surface light emitting device.

The white organic light emitting device according to the present invention does not require use in a specific device or preparation by a specific method, and can be manufactured using a method of manufacturing a white organic light emitting device using a conventional light emitting low molecular weight material.

The present invention will now be described in greater detail with reference to the following examples. The following examples are for illustrative purposes only and are not intended to limit the scope of the invention.

EXAMPLES

Example 1

A 15 Ω/cm² (1,000 Å) ITO-glass substrate used as an anode was cut to a size of 50 mm×50 mm×0.7 mm. The prepared substrate was ultrasonically cleaned in acetone, isopropyl alcohol and pure water, for 15 minutes each, and then further cleaned by exposure to ultraviolet (UV) rays for 30 minutes. NPB was vacuum deposited on the substrate to form a hole transport layer having a thickness of 400 Å. An emissive layer was formed on the hole transport layer by using the following processes: CBP as a host and BCzVBi as a dopant were vacuum deposited together on the hole transport layer in a weight ratio of 5 to 1, respectively, to form a blue emissive layer having a thickness of 100 Å; 40 Å of CBP as a host was vacuum deposited thereon to form a spacer layer; CBP as a host and 5 wt % Ir(ppy)$_3$ as a dopant were vacuum deposited together thereon, respectively, to form a green emissive layer having a thickness of 30 Å; 2 Å of CBP as a host was vacuum deposited thereon to form a spacer layer; CBP as a host and 4 wt % PQIr as a dopant were vacuum deposited together thereon, respectively, to form a red emissive layer having a thickness of 100 Å; 2 Å of CBP as a host was vacuum deposited thereon to form a spacer layer; CBP as a host and 5 wt % Ir(ppy)$_3$ as a dopant were vacuum deposited together thereon, respectively, to form a green emissive layer having a thickness of 30 Å; 40 Å of CBP as a host was vacuum deposited thereon to form a spacer layer; and CBP as a host and 5 wt % BCzVBi as a dopant were vacuum deposited together thereon, respectively, to form a blue emissive layer having a thickness of 100 Å. Thereafter, BCP was vacuum deposited on the emissive layer to form an electron transport layer having a thickness of 400 Å. A 10 Å layer of LiF and a 2,000 Å layer of Al were sequentially vacuum deposited on the electron transport layer to form an electron injection layer and a cathode, respectively. As a result, a white organic light emitting device was manufactured.

Example 2

A white organic light emitting device was manufactured in the same manner as in Example 1, except that a spacer layer was not formed between a green emissive layer and a red emissive layer.

Comparative Example 1

An organic layer was continuously grown on a clean glass substrate that was pre-coated with 150 nm of an ITO layer having a resistance of 20 Ω/cm² in a vacuum (about $10^{-7}$ torr). After the organic layer was formed, a shadow mask having an opening having a diameter of 1 mm was fixed in a glovebox filled with nitrogen. Then, 8 Å of LiF as a cathode and 500 Å of an Al cap were deposited on the organic layer by thermal evaporation in a high vacuum of $10^{-6}$ torr. The structure of the manufactured white organic light emitting device was as follow: ITO (glass), NPD (40 nm)/5% BczVBi:CBP (10 nm)/ CBP (4 nm)/4% PQIr:CBP (12 nm)/5% Ir(ppy)$_3$:CBP (8 nm)/ CBP (6 nm)/5% BczVBi:CBP (10 nm)/LiF/Al.

Evaluation

Maximum efficiencies and color purities of the white organic light emitting devices of Examples 1 and 2, and Comparative Example 1 were measured. The results are shown in Table 1 below:

TABLE 1

| | Characteristics | |
|---|---|---|
| | Maximum Efficiency (lm/W) | Color purity (x, y) |
| Example 1 | 18.4 | (0.37, 0.42) |
| Example 2 | 17.1 | (0.37, 0.44) |
| Comparative Example 1 | 15.5 | (0.42, 0.42) |

Referring to Table 1, it can be seen that the white organic light emitting devices according to the present invention have excellent luminescence efficiency.

Figure 5:
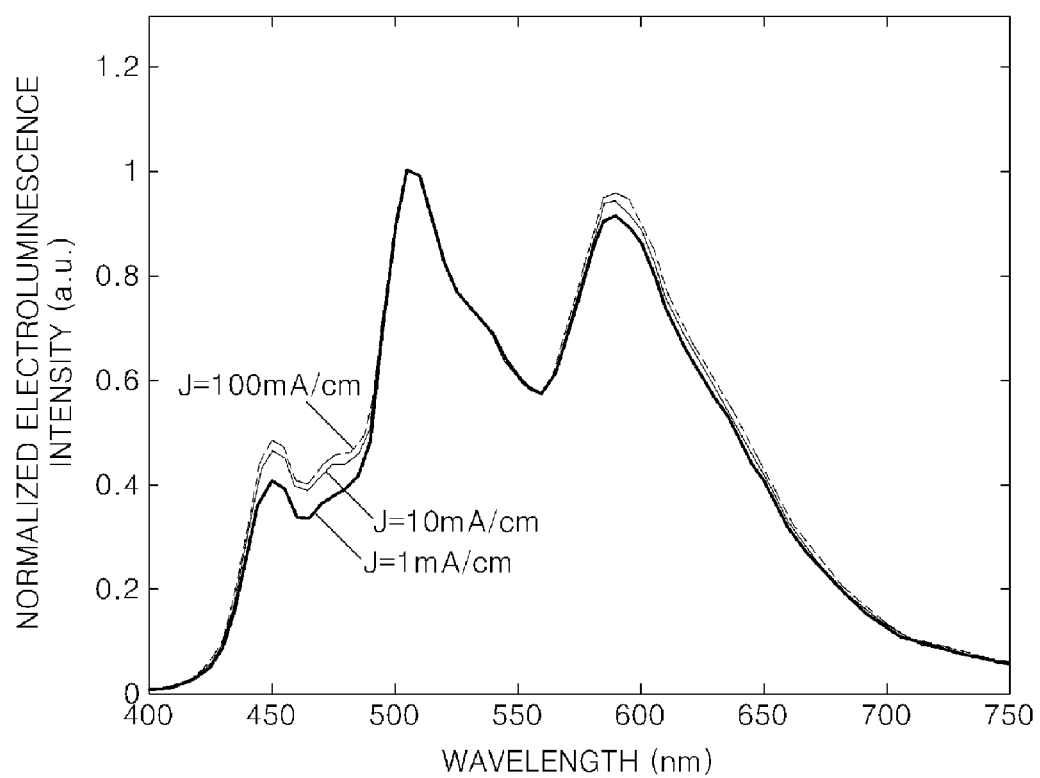

FIG. 5 is a graph of electroluminescence spectrum with respect to current density of the white organic light emitting device of Example 1. Referring to FIG. 5, it can be seen that the white organic light emitting device according to the present invention has less change in color according to a change in current density.

The white organic light emitting device according to the present invention has no color change due to a change in current density, excellent luminescence efficiency due to low loss energy exchange for the blue fluorescent material, and long lifespan, and as such can effectively be used in display and lighting devices.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A white organic light emitting device comprising an anode, a cathode and an organic layer disposed between opposing surfaces of the anode and the cathode, the organic layer comprising a first blue emissive layer, a first spacer layer disposed on a surface of the first blue emissive layer, a first green emissive layer disposed on a surface of the first spacer layer opposite the first blue emissive layer, a red emissive layer disposed on a surface of the first green emissive layer opposite the first spacer layer, a second green emissive layer disposed on a surface of the red emissive layer opposite the first green emissive layer, a second spacer layer disposed on a surface of the second green emissive layer opposite the red emissive layer, and a second blue emissive layer formed on a surface of the second spacer layer opposite the second green emissive layer, in this order from a surface of the anode, wherein each of the first and second blue emissive layers comprises a host material and a fluorescent dopant, the first and second green emissive layers and the red emissive layer each comprise a host material, and each of the first and second spacer layers consists essentially of a host material.

2. The white organic light emitting device of claim 1, wherein the thickness of each of the first and second blue emissive layers is about 2 to about 20 nm.

3. The white organic light emitting device of claim 1, wherein the thickness of each of the first and second green emissive layers is about 2 to about 20 nm.

4. The white organic light emitting device of claim 1, wherein the thickness of the red emissive layer is about 5 to about 30 nm.

5. The white organic light emitting device of claim 1, wherein the first and second green emissive layers and the red emissive layer comprise a host material and a phosphorescent dopant.

6. The white organic light emitting device of claim 1, wherein the host material is 4,4'-bis(N-carbazolyl)biphenyl (CBP), 1,3,5-tris(carbazol-9-yl) benzene (TCP), or 1,3-bis(carbazol-9-yl)benzene (mCP).

7. The white organic light emitting device of claim 1, wherein the thickness of the spacer layer is 4 to 10 nm.

8. The white organic light emitting device of claim 1, wherein the blue emissive layer comprises one selected from the group consisting of 4,4'-bis(9-ethyl-3-carbazovinylene)-1,1'-biphenyl (BczVBi), distyrylarylene (DSA), derivatives of DSA, distyrylbenzene (DSB), derivatives of DSB, 4,4'-bis(2,2'-diphenylvinyl)-1,1'-biphenyl (DPVBi), derivatives of DPVBi, spiro-DPVBi, and spiro-6P, as the fluorescent dopant.

9. The white organic light emitting device of claim 5, wherein the green emissive layer comprises $Ir(PPy)_3$ (PPy=2-phenylpyridine) or 3-(2-Benzothiazolyl)-7-(diethylamino)coumarin (coumarin 6), as a phosphorescent dopant.

10. The white organic light emitting device of claim 5, wherein the red emissive layer comprises any one selected from the group consisting of bis(2-phenylquinolyl-N,C2') acetylacetonate (PQIr), 4-(dicyanomethylene)-2-t-butyl-6-(1,1,7,7-tetramethyljulolidyl-9-enyl)-4H-pyran (DCJTB) and PtOEP, as the phosphorescent dopant.

11. The white organic light emitting device of claim 1, wherein the organic layer further comprises at least one layer selected from the group consisting of a hole injection layer, an electron blocking layer, a hole transport layer, an electron transport layer, a hole blocking layer and an electron injection layer.

12. The white organic light emitting device of claim 10, wherein the organic layer further comprises at least one layer selected from the group consisting of a hole injection layer, an electron blocking layer, a hole transport layer, an electron transport layer, a hole blocking layer and an electron injection layer.

13. A white organic light emitting device comprising an anode, a cathode and an organic layer disposed between opposing surfaces of the anode and the cathode, the organic layer comprising a first blue emissive layer, a first spacer layer disposed on a surface of the first blue emissive layer, a first green emissive layer disposed on a surface of the first spacer layer opposite the first blue emissive layer, a second spacer layer disposed on a surface of the first green emissive layer, a red emissive layer disposed on a surface of the second spacer layer opposite the first green emissive layer, a third spacer layer disposed on a surface of the red emissive layer opposite the second spacer layer, a second green emissive layer disposed on a surface of the third spacer layer opposite the red emissive layer, a fourth spacer layer disposed on a surface of the second green emissive layer opposite the third spacer layer, and a second blue emissive layer formed on a surface of the fourth spacer layer opposite the second green emissive layer, in this order from a surface of the anode, wherein each of the first and second blue emissive layers comprises a host material and a fluorescent dopant, the first and second green emissive layers and the red emissive layer each comprise a host material, and each of the first to fourth spacer layers consists essentially of a host material.

14. The white organic light emitting device of claim 13, wherein the first and second green emissive layers and the red emissive layer comprise a host material and a phosphorescent dopant.

15. The white organic light emitting device of claim 13, wherein the host material is 4,4'-bis(N-carbazolyl)biphenyl (CBP), 1,3,5-tris(carbazol-9-yl)benzene (TCP), or 1,3-bis(carbazol-9-yl)benzene (mCP).

16. The white organic light emitting device of claim 13, wherein the blue emissive layer comprises one selected from the group consisting of 4,4'-bis(9-ethyl-3-carbazovinylene)-1,1'-biphenyl (BczVBi), distyrylarylene (DSA), derivatives of DSA, distyrylbenzene (DSB), derivatives of DSB, 4,4'-bis(2,2'-diphenylvinyl)-1,1'-biphenyl (DPVBi), derivatives of DPVBi, spiro-DPVBi, and spiro-6P, as the fluorescent dopant.

17. The white organic light emitting device of claim 14, wherein the green emissive layer comprises $Ir(PPy)_3$ (PPy=2-phenylpyridine) or 3-(2-Benzothiazolyl)-7-(diethylamino)coumarin (coumarin 6), as the phosphorescent dopant.

18. The white organic light emitting device of claim 14, wherein the red emissive layer comprises any one selected from the group consisting of bis(2-phenylquinolyl-N,C2') acetylacetonate (PQIr), 4-(dicyanomethylene)-2-t-butyl-6-(1,1,7,7-tetramethyljulolidyl-9-enyl)-4H-pyran (DCJTB) and PtOEP, as the phosphorescent dopant.

* * * * *